United States Patent
Odnoblyudov

(10) Patent No.: US 9,853,197 B2
(45) Date of Patent: Dec. 26, 2017

(54) LIGHT EMITTING DIODE PACKAGE HAVING SERIES CONNECTED LEDS

(71) Applicant: Bridgelux, Inc., Livermore, CA (US)

(72) Inventor: Vladimir A. Odnoblyudov, Danville, CA (US)

(73) Assignee: Bridgelux, Inc., Livermore, CA (US)

( * ) Notice: Subject to any disclaimer, the term of this patent is extended or adjusted under 35 U.S.C. 154(b) by 0 days.

(21) Appl. No.: 14/869,507

(22) Filed: Sep. 29, 2015

(65) Prior Publication Data

US 2016/0093787 A1    Mar. 31, 2016

Related U.S. Application Data

(60) Provisional application No. 62/057,189, filed on Sep. 29, 2014.

(51) Int. Cl.

| | |
|---|---|
| *H01L 33/62* | (2010.01) |
| *H01L 25/07* | (2006.01) |
| *H01L 25/075* | (2006.01) |
| *H01L 33/50* | (2010.01) |
| *H01L 33/64* | (2010.01) |

(52) U.S. Cl.
CPC .......... *H01L 33/62* (2013.01); *H01L 25/0753* (2013.01); *H01L 33/502* (2013.01); *H01L 33/64* (2013.01); *H01L 2224/48091* (2013.01); *H01L 2224/48137* (2013.01); *H01L 2924/181* (2013.01)

(58) Field of Classification Search
CPC ............................ H01L 33/62; H01L 25/0753
See application file for complete search history.

(56) References Cited

U.S. PATENT DOCUMENTS

| | | | | |
|---|---|---|---|---|
| 7,868,346 B2 * | 1/2011 | Guo | ...................... | H05K 3/4007 257/99 |
| 8,193,015 B2 * | 6/2012 | Horng | .................. | H01L 27/156 257/594 |
| 8,284,350 B2 * | 10/2012 | Abe | .................. | G02F 1/133615 349/61 |
| 8,344,601 B2 * | 1/2013 | Baek | .................... | G02B 6/0023 313/46 |
| 8,368,190 B2 * | 2/2013 | Lee | .......................... | F21K 9/00 257/666 |
| 8,436,373 B2 * | 5/2013 | Mizutani | ............... | H01L 27/156 257/100 |

(Continued)

*Primary Examiner* — Ida M Soward
(74) *Attorney, Agent, or Firm* — Snell & Wilmer L.L.P.

(57) ABSTRACT

Light emitting diode packages as disclosed herein include a monolithic chip including at least a first and a second light emitting diode (LED) that are electrically coupled in series, wherein the first and the second LEDs each include at least one electrical terminal configured to be electrically coupled to a power source. The monolithic chip is mounted onto a connection substrate having first and second landing pads formed from metallic material and electrically isolated from each other. The monolithic chip is mounted to the connection substrate such that the electrical terminal of the first LED is electrically connected to the first landing pad and the electrical terminal of the second LED is electrically connected to the second landing pad. In an example, the monolithic chip includes a third and a fourth LED electrically coupled to each other in series, and electrically coupled to the first and second LEDs in parallel.

17 Claims, 4 Drawing Sheets

(56) References Cited

U.S. PATENT DOCUMENTS

| | | | |
|---|---|---|---|
| 8,445,933 B2* | 5/2013 | Lee | F21K 9/00 257/100 |
| 8,455,908 B2* | 6/2013 | Welch | H01L 25/0753 257/100 |
| 8,525,216 B2* | 9/2013 | Chen | H01L 25/0753 257/59 |
| 9,018,655 B2* | 4/2015 | Tu | H01L 33/52 257/96 |
| 9,093,293 B2* | 7/2015 | Ibbetson | H01L 25/0753 |
| 9,368,548 B2* | 6/2016 | Lee | H01L 27/153 |
| 9,673,363 B2* | 6/2017 | Donofrio | H01L 33/60 |
| 2006/0163589 A1* | 7/2006 | Fan | H01L 27/153 257/88 |
| 2008/0121905 A1* | 5/2008 | Wu | H01L 25/0753 257/93 |
| 2009/0134422 A1* | 5/2009 | Sah | H01L 25/0753 257/99 |
| 2010/0006864 A1* | 1/2010 | Steigerwald | H01L 25/167 257/88 |
| 2010/0163900 A1* | 7/2010 | Seo | H01L 33/007 257/98 |
| 2011/0215349 A1* | 9/2011 | An | H01L 33/08 257/89 |
| 2011/0254036 A1* | 10/2011 | Kim | H01L 33/20 257/98 |
| 2012/0043563 A1* | 2/2012 | Ibbetson | H01L 25/0753 257/88 |
| 2012/0193661 A1* | 8/2012 | Emerson | H01L 33/20 257/98 |
| 2013/0049038 A1* | 2/2013 | Jeong | H01L 27/153 257/91 |
| 2013/0087817 A1* | 4/2013 | An | H01L 33/08 257/89 |
| 2013/0341657 A1* | 12/2013 | Oyaizu | F21K 9/135 257/89 |
| 2014/0153238 A1* | 6/2014 | Nishimura | H01L 25/0753 362/237 |
| 2014/0197433 A1* | 7/2014 | Ishizaki | F21V 3/00 257/91 |
| 2014/0240974 A1* | 8/2014 | Hussell | F21K 9/60 362/231 |
| 2014/0252384 A1* | 9/2014 | Xu | H01L 25/0753 257/88 |
| 2014/0362565 A1* | 12/2014 | Yao | H01L 25/0753 362/223 |
| 2015/0028754 A1* | 1/2015 | Siessegger | H05B 33/0803 315/186 |
| 2015/0077991 A1* | 3/2015 | Palfreyman | H05B 33/0821 362/235 |
| 2015/0123160 A1* | 5/2015 | Hsu | H01L 25/0753 257/99 |
| 2015/0311391 A1* | 10/2015 | Chen | H01L 33/647 257/88 |
| 2015/0345714 A1* | 12/2015 | Reiherzer | H01L 33/50 362/235 |
| 2016/0013164 A1* | 1/2016 | Tudorica | H01L 33/56 257/89 |
| 2016/0066382 A1* | 3/2016 | Odnoblyudov | H05B 33/0827 315/185 R |
| 2016/0315228 A1* | 10/2016 | Chou | H01L 25/0753 |

* cited by examiner

LIGHT EMITTING DIODE PACKAGE HAVING SERIES CONNECTED LEDS

CROSS-REFERENCE TO RELATED APPLICATIONS

This patent application claims the benefit of U.S. Provisional Patent Application No. 62/057,189 filed on Sep. 29, 2014, which is hereby incorporated by reference in its entirety.

FIELD

Disclosed herein are light emitting diode array constructions, light emitting diode array packages comprising the same, and methods for making the same.

BACKGROUND

Light emitting diode (LED) packages for end-use lighting applications are known the art. FIG. 1 illustrates an example known LED package 10 comprising a single LED 12, which is a lateral or vertical LED, comprising a P contact 14 and an N contact 16 positioned along a top surface 18 of the LED and on an LED substrate 20, e.g., one that active material used to form the P and N junctions is epitaxially grown on. The LED 12 is disposed on a metal substrate 22 comprising P and N electrical terminals 24 and 26 that are separated from one another and held together by an electrically nonconductive material 28. The LED 12 is electrically connected with the metal substrate by wires 30 and 32 respectively extending from the LED P contact 14 and that is wired bonded to the metal substrate P terminal 24, and from the LED N contact 16 and that is wire bonded to the metal substrate N terminal 26. The LED may be encapsulated with a wavelength conversion material 34 to facilitate light emission from the LED in a particular wavelength.

Arrays of such known LEDs, e.g., two or more lateral or vertical LEDs, may be formed by interconnecting the P contact of one LED to an N contact of an adjacent LED in series by wires extending along the top surface of the LEDs. FIG. 2 illustrates an array 40 of known LEDs, e.g., a 3x3 array of lateral or vertical LEDS, wherein the LEDs 42 in the array are connected with in series to one another by wires 44 extending along the top surface between the P and N contacts of adjacent LEDs. The serially connected LEDs are then connected in parallel to the metal substrate by a wire 46 extending from the P contact of a first LED in the series to the P terminal 48 of the metal substrate, and a wire 50 extending from the N contact of a last LED in the series to the N terminal 52 of the metal substrate.

A feature of such known LED package is that they are costly to make given the time and labor associated with forming the wired connections from the LED to the metal substrate and, in an array configuration additionally with forming the wired serial electrical connections between the individual LEDs. Further, such LED packages are known to have less than optimal thermal properties, as the LED or LEDs in an array generate a large amount of heat when powered, which heat largely remains in the LED and is not efficiently extracted or removed therefrom during operation, thereby operating to reduce LED service life and reduce the service life of lighting devices or assemblies comprising the same.

It is, therefore, desired that LED package be constructed in a manner that is both cost efficient to make, and that has improved thermal performance properties when compared to such above-described LED constructions and packages.

BRIEF DESCRIPTION OF THE DRAWINGS

These and other features and advantages of light emitting diode constructions, assemblies comprising the same, and methods for making the same as disclosed herein will be appreciated as the same becomes better understood by reference to the following detailed description when considered in connection with the accompanying drawings.

SUMMARY

Light emitting diode packages as disclosed herein comprise a monolithic chip including at least a first and a second light emitting diode (LED) that are electrically coupled in series. The first and the second LEDs each include at least one electrical terminal configured to be electrically coupled to a power source. In an example embodiment, LEDs are flip chip LEDs and the electrical terminals extend along a common surface of the LEDs. The monolithic chip is mounted onto a connection substrate that includes first and second landing pads which are formed from a metallic material and that are electrically isolated from each other. In an example, the connection substrate includes a silicone material interposed between the first and second landing pads and extending around and edge of the connection substrate. The monolithic chip is mounted to the connection substrate such that the electrical terminal of the first LED is electrically connected to the first landing pad and the electrical terminal of the second LED is electrically connected to the second landing pad. In an example, the monolithic chip includes a third and a fourth LED electrically coupled to each other in series, and electrically coupled to the first and second LEDs in parallel. In such example, the first and second terminals operate to provide the parallel electrical connection between the LEDs.

LED packages as disclosed herein are made by the steps of forming a monolithic wafer comprising a number of LEDs. Forming a series electrical connection between LEDs that are oriented in a sting, and forming a parallel electrical connection between LEDs in the string, wherein the steps of forming the series and parallel electrical connections are done at the wafer level. In an example, the monolithic wafer may have two or more strings of serially connected LEDs, and the parallel electrical connection between LEDs in the two or more strings may be provided by first and second electrical terminals formed on the monolithic wafer. The so-formed wafer is then connected with the connection substrate so that the first and second electrical terminals are in contact with the connection substrate first and second landing pads to both provide an electrical connection therebetween, and to facilitate the transfer of heat or thermal energy from the monolithic wafer during operation of the LED package to thereby provide improved thermal operating efficiency and performance.

DETAILED DESCRIPTION

Light emitting diodes (LEDs) and packages comprising the same as disclosed herein are specially constructed having a flip chip architecture configured to promote use in an array and packaging with a metal connection substrate in a manner that is both cost efficient and that provides improved thermal properties when compared to the conventional LED packages discussed above.

Figure 1:
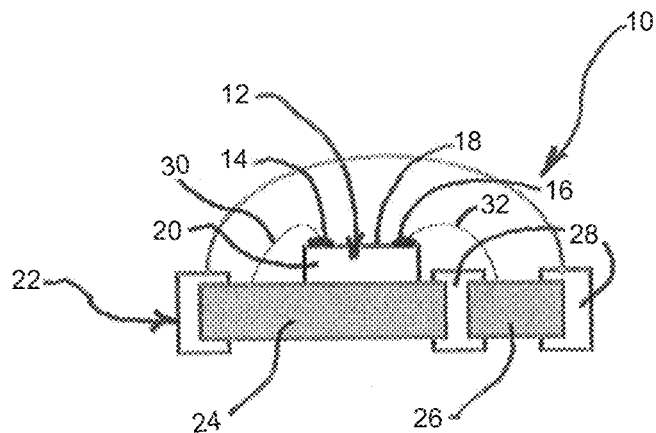
FIG. 1 is a cross-sectional side view of a known light emitting diode package.
Figure 2:
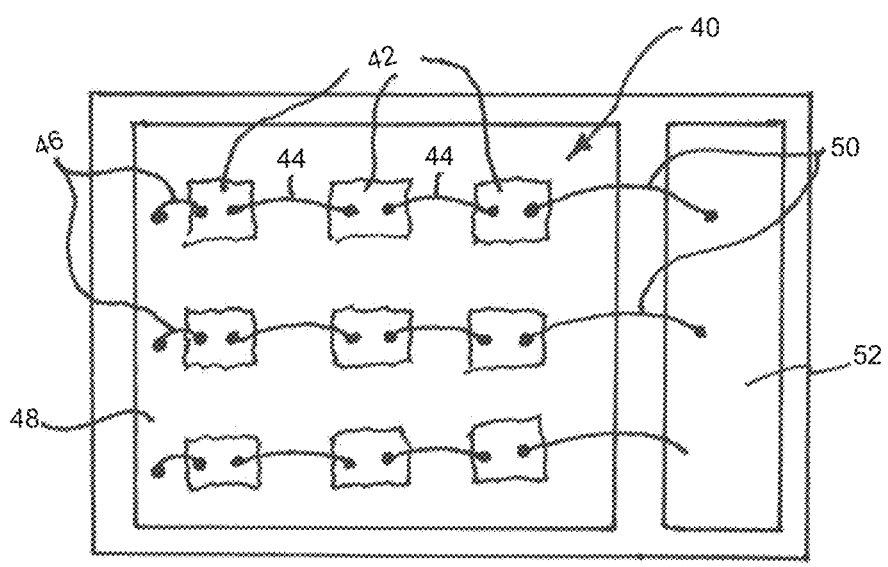
FIG. 2 is a top view of a known light emitting diode array package.
Figure 3:
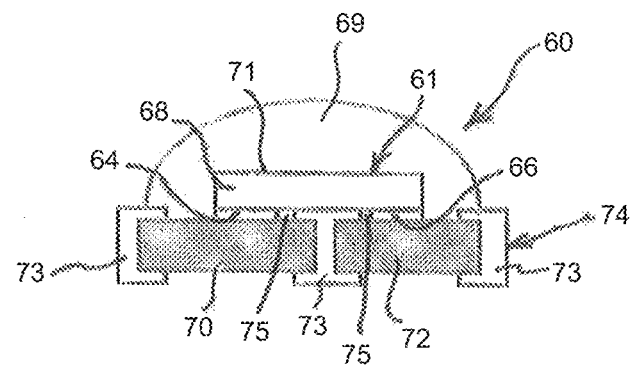
FIG. 3 is a cross-sectional side view of an example monolithic light emitting diode array package as disclosed herein.

FIG. 3 illustrates an LED package 60 as disclosed herein comprising a monolithic wafer or die 61 comprising one or more LEDs. In an example, the monolithic die may include a single LED and the LED may be a flip chip LED comprising P and N contacts 64 and 66 that are disposed along a common surface of the LED. In such embodiment, the LED comprises a transparent substrate 68 through which light is emitted upon powering the LED, wherein the P and N contacts are positioned along a surface of the LED opposite a top surface 71 of the transparent substrate 68. The flip chip LED may be formed by conventional technique, e.g., by epitaxially depositing a desired active material onto a compatible substrate material. In an example, the active material may be selected produce light in a blue wavelength in the range of from about 400 to 500 nm, herein referred to as a blue flip chip LED. In an example, the blue flip chip LED comprises an active material formed for example from GaN that has been grown, e.g., epitaxially grown, onto a transparent substrate such as one formed from sapphire or the like having a crystalline lattice structure that is compatible with the active material, e.g., GaN. This is but one example of the type of active material and substrate that can be used to form flip chip LEDs useful for forming LED packages as disclosed herein, and it is to be understood that such example is provided for references and that the types of flip chip LEDs within the scope of the concept as disclosed herein are not limited as to the types of active materials or substrates that may be used to form the same. The LED may be encapsulated with a wavelength converting material 69 such as conformal phosphor or the like for the purpose of converting the wavelength of light produce by the LED to a desired wavelength for an end-use application.

The LED P and/or N contacts 64 and 66 may be fanned out, or their respective surface area enlarged/expanded, so as to form P and/or N terminals to facilitate connection with respective P and N terminals or contact pads 70 and 72 of a connection substrate 74 used both to accommodate mechanical attachment of the LED and provide electrical power thereto. In an example, the LED P and N contacts or terminals 64 and 66 are sized to both facilitate a desired electrical contact with the respective connection substrate P and N terminals or contact pads 70 and 72, and to facilitate a desired level of heat or thermal transfer from the LED to the connection substrate to provide an improved level of thermal properties, improving the service life of the LEDs and the package comprising the same. In an example, the P and N terminals 70 and 72 of the connection substrate are formed from a metallic material such as copper or the like.

As illustrated in FIG. 3, the P and N terminals 70 and 72 of the connection substrate 74 are separated from one another by an electrically insulating material 73, which in an example embodiment may be a polymeric material such as silicone or the like. In an example, open spaces 75 may exist between the electrically insulating material 73 and the LED P and N contacts 64 and 66. An electrically insulating material 73 is also disposed along outer edges of the P and N terminals 70 and 72 and operates both to insulate the outer edges and to hold the P and N terminals together. In an example, the electrically insulating material disposed along the outer edges of the conductive substrate may be formed from the same material used to separate the P and N terminals. In an example, the connection substrate comprising the P and N terminals, the insulating material interposed therebetween, and the insulating material disposed around the edge of the P and N terminals, may be formed by a molding process.

Example LED packages as disclosed herein may comprise a single LED or a number of LEDs connected with the connection substrate. In an example where the LED package comprises a single LED, such LED comprises a single P contact and single N contact that is placed into contact with the respective P and N terminal of the connection substrate. In an example where the LED package comprises a number of LEDs, such LEDs may be provided in combined form as a monolithic wafer or die, wherein the monolithic wafer comprises a number of P and N contacts associated with each LED, and wherein the P and N contacts are disposed along a common wafer surface.

Figure 4:
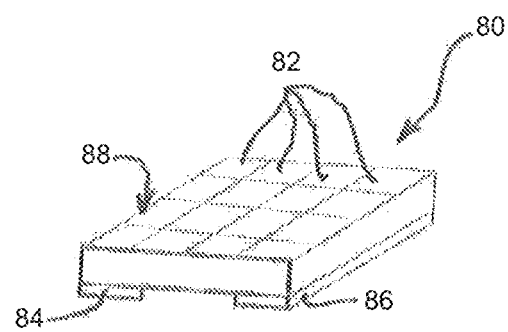
FIG. 4 is a perspective view of an example monolithic light emitting diode array as disclosed herein.

FIG. 4 illustrates a monolithic wafer 80 comprising an array of LEDs 82, and in an example embodiment the LEDs are flip chip LEDs. In the illustrated example, the monolithic wafer comprises a 4×4 array of LEDs or 16 LEDs. However, it is to be understood that the number and arrangement of LEDs in the monolithic wafer may be other than that disclosed and illustrated. For example, the monolithic wafer may comprise two or more LEDs that are oriented extending along a common axis, or may comprise two or more LEDs that are oriented along a first axis and a second axis perpendicular to the first axis, e.g., in an array where the LEDs in the array are in a series-parallel electrical connection. The particular number and arrangement of LEDs within the monolithic wafer is understood to vary depending on the particular end-use application.

In example illustrated in FIG. 4, the monolithic wafer 80 comprises P and N terminals 84 and 86 extending along a common surface of the wafer opposite the wafer substrate top surface 88. The P and N terminals extend in a direction parallel with one another and are in parallel electrical connection with respective P contacts of terminal LEDs positioned at one end of the array, and are in parallel electrical connection with respective N contacts of terminal LEDs positioned at an opposite end of the array. As described above, the P and N terminals 84 and 86 may be configured to provide both a desired degree of electrical contact with the connection substrate, and a desired degree of thermal transfer from the LED array to the connection substrate to thereby provide improved thermal performance properties during operation.

Figure 5:
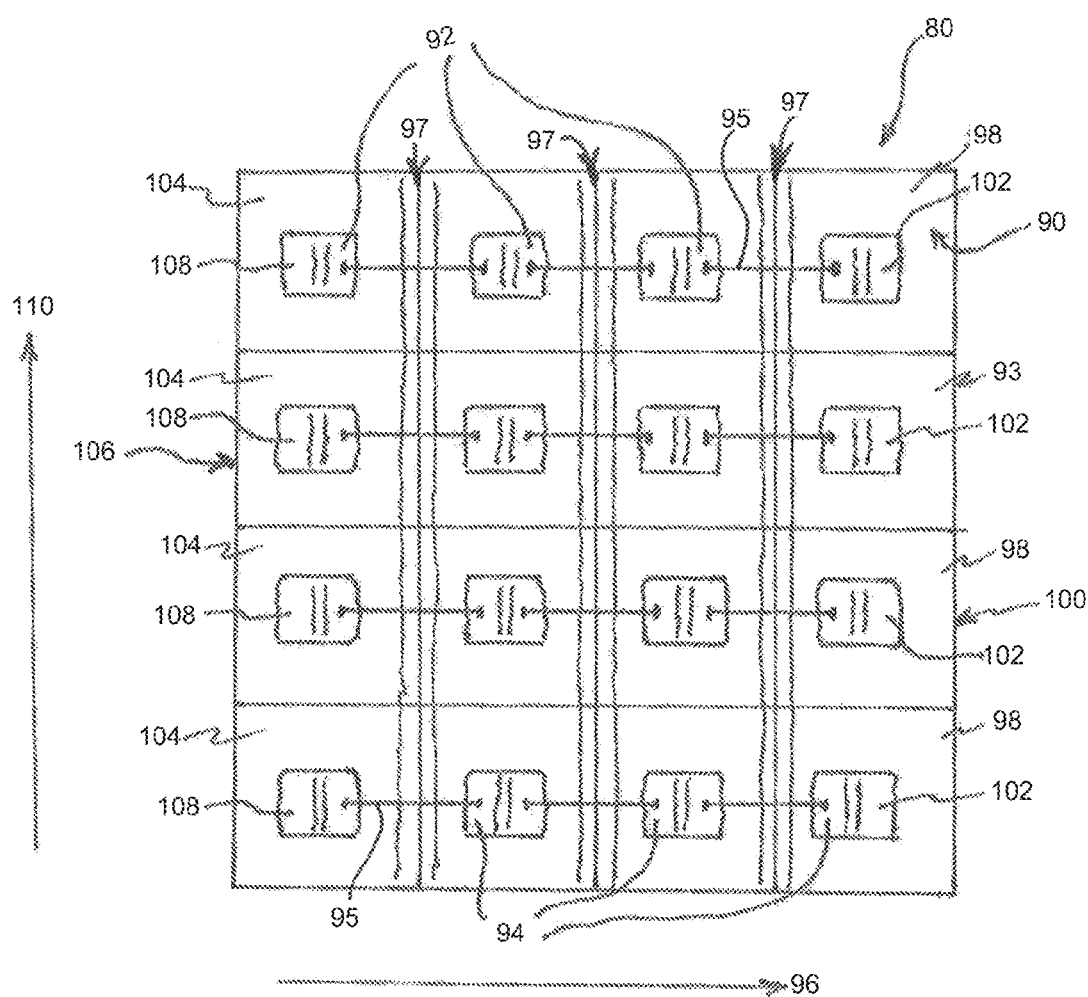
FIG. 5 is a bottom view of an example monolithic light emitting diode array as disclosed herein.

FIG. 5 illustrates an underside surface 90 of the monolithic wafer 80 of FIG. 4 prior to forming the P and N terminals (84 and 86 with reference to FIG. 4). A feature of LED packages as disclosed herein, comprising the use of a monolithic wafer having a number of LEDs, is the ability to provide a desired series and parallel electrical connection between the LEDs on the wafer itself, i.e., at the wafer level thereby avoiding the costs and labor associated with making such connections by wire bonding among individual LEDs, i.e., after the wafer has been diced to form the separate LEDs. In an example, a series electrical connection is made between the LEDs in each of the rows extending along a common first axis 96 by connecting P contacts 92 of an LED in each row with N contacts 94 of an adjacent LED in the same row. The series electrical connection between the P and N contacts within a row can be made by wire connection 95, by electrically conductive vias formed in the wafer, or by other electrically conductive element. In an example, the underside surface 90 may comprise recessed regions 97 extending along the wafer between adjacent LEDs in series connection. Again, a feature of the concept as disclosed herein is that such electrical connections between the LEDs are being done at the wafer level.

The array includes terminal LEDs 98 positioned at one end 100 of each row running along axis 96 that comprises a P contact 102, and includes terminal LEDs 104 positioned at an opposite end 106 of each row running along axis 96 that comprises an N contact 108. The LEDs in the rows running along axis 96, and that are in series electrical connection within the row, are placed into parallel electrical connection with each other by connecting together the P and N contacts 102 and 108 of the end LEDs 98 and 104, wherein the parallel connection extends along the axis 110, which is perpendicular to axis 96. Such parallel electrical connection can be made in the same manner as was done to provide the series electrical connection between the LEDs, e.g., by wire connection, electrically conductive vias formed in the wafer, or by other electrically conductive element, again all taking place at the wafer level. In an example, such parallel connection between the P and N contacts 102 and 108 is made by configuring such respective P and N contacts to connect with one another to form a respective P and N terminal (as illustrated in FIG. 4), e.g., by fanning out, enlarging or expanding the contact configurations. Alternatively, such parallel connection between the P and N contacts 102 and 108 can be made through the use of separate metallic electrodes that are configured to be attached with each of the respective P and N contacts 102 and 108, which electrodes thereby form the P and N terminals for the monolithic wafer. The monolithic array and/or the P and N terminals are configured in such a manner so that the P and N terminals do not make direct contact with respective N and P contacts of the LEDs in the array.

Figure 6:
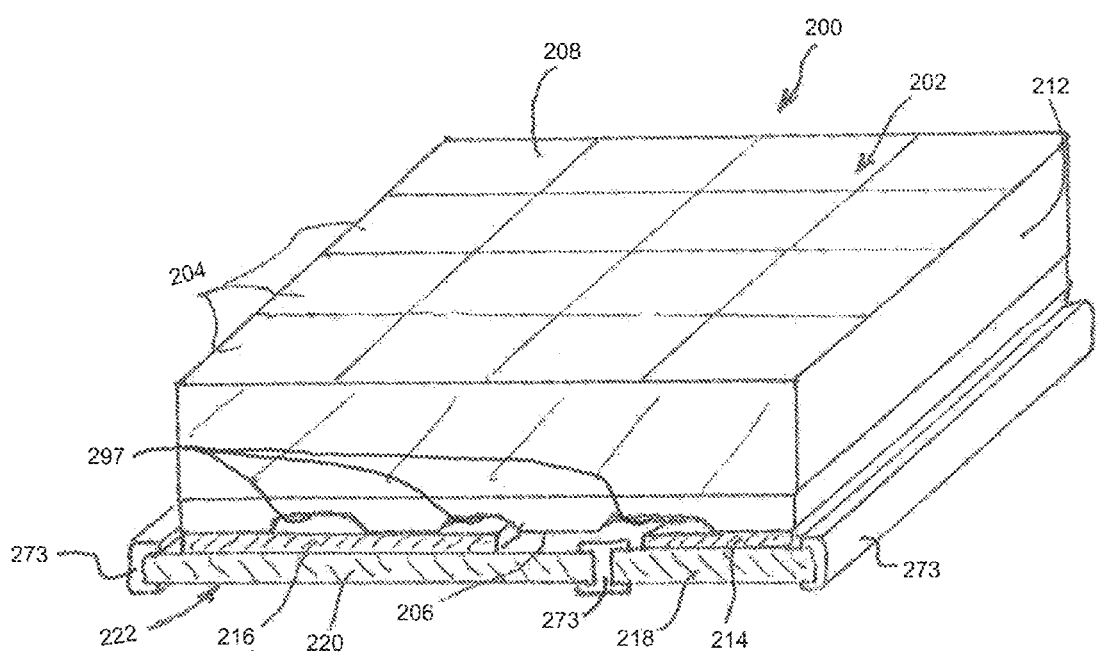
FIG. 6 is a perspective side view of an example monolithic light emitting diode array package as disclosed herein.

FIG. 6 illustrates an example LED package 200 as disclosed herein comprising monolithic wafer 202 as disclosed above with reference to FIGS. 4 and 5, comprising a plurality of LEDs 204, e.g., flip chip LEDs, forming an array that is in series-parallel electrical connection along a common surface 206 opposite a top surface 208 of the wafer, which is a top surface of a transparent substrate 212. The common surface 206 comprising recessed regions 297 (shown as 97 in FIG. 4). The monolithic wafer comprises a P terminal 214 and an N terminal 216 that are configured to provide a desired degree of electrical contact with respective P and N terminals or landing pads 218 and 220 of the connection substrate 222 to power the LED array, and to provide a desired degree of heat transfer from the LED array during operation. The connection substrate P and N landing pads 218 and 220 are separated from one another by the electrically insulating material 273, and the electrically insulating material 273 is also disposed along outer edges of the P and N landing pads 218 and 220 to insulate the outer edges of the LED package.

A feature of LED packages as disclosed herein is that the LEDs contained therein are provided in the form of a monolithic wafer and the electrical circuitry between the LEDs is formed at the wafer level, thereby reducing production costs. Further, LED packages as disclosed herein comprise flip chip LEDs having P and N terminals disposed along a common surface to facilitate attaching the monolithic LED array to respective P and N terminals or landing pads of a connection substrate wafer. The ability to physically connect the monolithic LED array to the connection substrate through the P and N terminals enables for the thermal transfer of heat from the LED array during operation, thereby providing improved thermal performance properties when compared to the conventional LED packages disclosed above.

Although certain specific embodiments of LED packages have been described and illustrated for purposes or reference, it is to be understood that the disclosure and illustrations as provided herein not limited to the specific embodiments. Accordingly, various modifications, adaptations, and combinations of various features of the described embodiments can be practiced without departing from the scope what has been disposed herein including the appended claims.

What is claimed is:

1. A light emitting diode package comprising:
a monolithic chip including at least a first and a second light emitting diode (LED) that are electrically coupled in series, wherein the first and the second LEDs each include at least one electrical terminal configured to be electrically coupled to a power source, wherein the first and second LEDs are flip chip diodes, and wherein the electrical terminals extend along a common surface of the respective first and second LEDs; and
a connection substrate having a first and second landing pad which are electrically isolated from each other, wherein the electrical terminal of the first LED is electrically connected to the first landing pad and the electrical terminal of the second LED is electrically connected to the second landing pad;
wherein the monolithic chip further comprises a third and a fourth LED electrically coupled to each other in series, and electrically coupled to the first and second LEDs in parallel.

2. The LED package as recited in claim 1 wherein the landing pads of the connection substrate are metal.

3. The LED package as recited in claim 1 wherein the landing pads of the connection substrate are copper.

4. The LED package as recited in claim 1 wherein the connection substrate comprises a silicone material interposed between the landing pads.

5. The LED package as recited in claim 4 wherein the connection substrate comprises a silicone material disposed along outer edges of the connection substrate.

6. A light emitting diode package comprising;
a monolithic wafer comprising an array of flip chip light emitting diodes (LEDs), wherein the LEDs are arranged in a number of rows extending along a first axis and the LEDs within each row being in series electrical connection with each other, wherein LEDs at the ends of each row are in parallel electrical connection so that the array of LEDs is in series-parallel connection, wherein the monolithic wafer comprises first and second electrical terminals that extend along a common surface of the wafer and that are in electrical connection with the LEDs; and
a connection substrate comprising first and second landing pads that are connected with respective first and second electrical terminals, wherein the connection substrate comprises an electrically isolating material interposed between the first and second landing pads and disposed along an outside edge of connection substrate.

7. The LED package as recited in claim 6 wherein LEDs at one end of each row are connected with the first electrical terminal, and the LEDs at an opposite end of each row are connected with the second electrical terminal.

8. The LED package as recited in claim 7 wherein the first and second electrical terminals are parallel to one and extend along a second axis that is perpendicular to the first axis.

9. The LED package as recited in claim 6 wherein the electrically isolating material is a silicone compound.

10. The LED package as recited in claim 6 wherein the first and second landing pads are formed from a metallic material.

11. The LED package as recited in claim 6 further comprising a wavelength converting material disposed over the monolithic wafer.

12. The LED package as recited in claim 6 wherein the connection substrate is a molded construction of the landing pads and the electrically insulating material.

13. A light emitting diode package comprising;
a plurality of flip chip light emitting diodes (LEDs), wherein the two or more LEDs are in series electrical connection with one another, and wherein two or more of the LEDs in series electrical connection are in parallel electrical connection with other LEDs in series electrical connection, wherein the LEDs are in electrical connection along a common surface with first and second electrical terminals; and
a connection substrate comprising first and second landing pads that electrically isolated from one another, the first and second landing pads being connected with the respective first and second electrical terminals.

14. The light emitting diode package as recited in claim 13 wherein the LEDs are in the form of a monolithic wafer.

15. The light emitting diode package as recited in claim 13 wherein LEDs in series electrical connection are in a string, and wherein the LEDs at ends of the strings are in parallel electrical connection.

16. The light emitting diode package as recited in claim 13 wherein the first and second electrical terminals are sized larger than electrical contacts of the LEDs that the first and second electrical terminals are connected with.

17. The light emitting diode package as recited in claim 13 wherein the LEDs in series electrical connection are arranged within rows, and the LEDs in parallel electrical connection with one another are arranged perpendicular to the rows, wherein the first terminal is in electrical contact with LEDs having a parallel P electrical connection, and wherein the second terminal is in electrical contact with LEDs having a parallel N electrical connection.

* * * * *